United States Patent
Choi et al.

(10) Patent No.: US 7,601,588 B2
(45) Date of Patent: Oct. 13, 2009

(54) METHOD OF FORMING A TRENCH ISOLATION LAYER AND METHOD OF MANUFACTURING A NON-VOLATILE MEMORY DEVICE USING THE SAME

(75) Inventors: Jong-Wan Choi, Daejeon-si (KR); Hong-Gun Kim, Gyeonggi-do (KR); Kyu-Tae Na, Seoul (KR); Eunkee Hong, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 439 days.

(21) Appl. No.: 11/267,360

(22) Filed: Nov. 4, 2005

(65) Prior Publication Data
US 2006/0094203 A1 May 4, 2006

(30) Foreign Application Priority Data
Nov. 4, 2004 (KR) .................. 10-2004-0089213

(51) Int. Cl.
*H01L 21/336* (2006.01)
(52) U.S. Cl. .................. 438/257; 257/E21.68
(58) Field of Classification Search .......... 438/257, 438/259, 267, 296, 304, 596; 257/314–316, 257/319, 396, E21.666, E21.68
See application file for complete search history.

(56) References Cited

U.S. PATENT DOCUMENTS

| 6,159,801 A | * | 12/2000 | Hsieh et al. ............ 438/259 |
| 7,151,295 B2 | * | 12/2006 | Yaegashi et al. ......... 257/316 |
| 2002/0081817 A1 | | 6/2002 | Bhakta et al. |

FOREIGN PATENT DOCUMENTS

| JP | 2003-031650 | 1/2003 |
| KR | 1020020088554 | 11/2002 |

* cited by examiner

*Primary Examiner*—David Vu
(74) *Attorney, Agent, or Firm*—Myers Bigel Sibley & Sajovec, P.A.

(57) ABSTRACT

In a method of forming a device isolation layer for minimizing a parasitic capacitor and a non-volatile memory device using the same, a trench is formed on a substrate. A first insulation layer is formed on a top surface of the substrate and on inner surfaces of the trench, so that the trench is partially filled with the first insulation layer. A second insulation layer is formed on the first insulation layer to a thickness to fill up the trench, thereby forming a preliminary isolation layer. An etching rate of the second insulation layer is different from that of the first insulation layer. A recess is formed at a central portion of the preliminary isolation layer by partially removing the first and second insulation layers, thereby forming the device isolation layer including the recess. The recess in the device isolation layer reduces a parasitic capacitance in a non-volatile memory device.

17 Claims, 10 Drawing Sheets

METHOD OF FORMING A TRENCH ISOLATION LAYER AND METHOD OF MANUFACTURING A NON-VOLATILE MEMORY DEVICE USING THE SAME

CROSS-REFERENCE TO RELATED APPLICATION

This application claims priority to Korean Patent Application No. 2004-89213 filed on Nov. 4, 2004, the content of which is herein incorporated by reference in its entirety.

FIELD OF THE INVENTION

The present invention relates generally to semiconductor devices and, more particularly, to non-volatile memory devices.

BACKGROUND OF INVENTION

Non-volatile memory devices can maintain stored data even after power to the devices is turned off, and have an advantage in that the data stored in the non-volatile memory devices may be electrically erasable or programmable. For those reasons, non-volatile memory devices have been widely used in various portable electronic appliances for storing data. Recently, non-volatile memory devices have been used in highly technical appliances, such as digital cameras, MP3 players, cellular phones, etc.

FIG. 1 is a cross sectional view illustrating a conventional non-volatile memory device.

Referring to FIG. 1, a conventional non-volatile memory device includes a control gate 20, a tunnel oxide layer 14 and a floating gate 16 interposed between the control gate 20 and the tunnel oxide layer 14. An oxide/nitride/oxide (ONO) layer 18 is positioned between the control gate 20 and the floating gate 16.

Electrons are injected into the floating gate 16 from a channel by a channel hot carrier and are injected into the channel from the floating gate 16 by a Fowler-Nordheim (F-N) tunneling current, thereby programming and erasing data in a cell of the non-volatile memory device. When electrons are injected into the floating gate 16, a potential energy of the floating gate 16 is changed; thus, a threshold voltage of a transistor is varied in accordance with the potential energy change. As a result, data are programmed into the cell of the non-volatile memory. When the F-N tunneling current flows across the tunnel oxide layer 14, the electrons in the floating gate 16 are extracted into the channel, thereby erasing the data in the cell of the non-volatile memory device.

A non-volatile memory device is operated at a time when a control gate voltage, which is a voltage applied to the control gate 20 from a power source, is applied to the floating gate 18 (hereinafter referred to as floating gate voltage). Accordingly, a ratio of the floating gate voltage with respect to the control gate voltage (hereinafter referred to as coupling ratio) has an effect on operation characteristics of the non-volatile memory device. A conventional coupling ratio is influenced by capacitance $C_{ono}$ of the ONO layer 18 and capacitance $C_{tun}$ of the tunnel oxide layer 14, as indicated in the following equation (1).

$$\gamma = \frac{C_{ono}}{C_{tun} + C_{ono}} \tag{1}$$

In the above equation (1), γ denotes the coupling ratio of a non-volatile memory device.

However, recent high integration degree in a non-volatile memory device has remarkably reduced a cell distance between cells adjacent to each other in the non-volatile memory device, so that parasitic capacitance between the floating gates in the neighboring cells is no longer negligible. For this reason, the coupling ratio is required to be accommodated in view of the parasitic capacitance ($C_{fg}$) between floating gates adjacent to each other. That is, the floating gate voltage is determined by an adjacent control gate voltage that is applied to a control gate for a neighboring word line adjacent to a predetermined cell, as well as by the control gate voltage for the predetermined cell in a non-volatile memory device. Accordingly, the floating gate voltage is determined by both the control gate voltage and the adjacent control gate voltage. For this reason, the floating gate voltage and the coupling ratio is modified as illustrated in the following equations (2) and (3).

$$V_{fg} = \frac{C_{ono}V_{cg} + C_{fg}V_1 + C_{fg}V_2}{C_{tun} + C_{ono} + 2C_{fg}} \tag{2}$$

$$\gamma_{fg} = \frac{C_{fg}}{C_{tun} + C_{ono} + 2C_{fg}} \tag{3}$$

As a result, the coupling ratio is reduced due to the parasitic capacitance $C_{fg}$, and programming and erasing data in the predetermined cell is influenced by a word line adjacent to the predetermined cell. Furthermore, a threshold voltage is varied in accordance with a change of potential energy of a neighboring floating gate. Particularly, the above threshold voltage variation causes an operation failure, for example, a read/write error in a non-volatile memory device. The smaller the width and gap distance between the cells adjacent to each other are, the more frequently and seriously generated the operation failure is.

An exemplary method of reducing parasitic capacitance $C_{fg}$ is disclosed in Korean Laid-Open Patent Publication No. 2002-088554. According to the above Korean patent publication, a recessed portion is formed on a device isolation layer through a dry etching process, and polysilicon is deposited into the recessed portion as a floating gate, so that the floating gate is formed in the recessed portion of the device isolation layer. Accordingly, the parasitic capacitance is minimized due to the recessed portion. However, the dry etching for the recessed portion can cause damage to a top surface of the floating gate and the device isolation layer, thereby reducing the reliability of the device.

SUMMARY OF THE INVENTION

Accordingly, the present invention provides a method of forming a device isolation layer for reducing parasitic capacitance.

The present invention also provides a method of manufacturing non-volatile memory devices in which parasitic capacitance is reduced.

According to an exemplary embodiment of the present invention, there is provided a method of forming a device isolation layer for minimizing parasitic capacitance. A trench is formed at a surface portion of a substrate. A first insulation layer is formed on a top surface of the substrate and on inner surfaces of the trench, so that the trench is partially filled with the first insulation layer. A second insulation layer is formed on the first insulation layer to a thickness to fill up the trench, thereby forming a preliminary isolation layer. An etching rate of the second insulation layer is different from that of the first insulation layer. A recess is formed at a central portion of the preliminary isolation layer by partially removing the first and second insulation layers, thereby forming the device isolation layer including the recess.

According to another exemplary embodiment of the present invention, there is provided a method of manufacturing a non-volatile memory device. A hard mask pattern is formed on a substrate, and the substrate is etched using the hard mask pattern as an etching mask, thereby forming a trench at a surface portion of the substrate. Conductive structures on the substrate are isolated from each other by the trench. A first insulation layer is formed on top and side surfaces of the hard mask pattern and on inner surfaces of the trench, so that the trench is partially filled with the first insulation layer. A second insulation layer is formed on the first insulation layer to a thickness to fill up the trench, thereby forming a preliminary isolation layer including the first and second insulation layers. An etching rate of the second insulation layer is different from that of the first insulation layer. The hard mask pattern is removed from the substrate so that a portion of the substrate defined by the preliminary isolation layer is exposed. A tunnel oxide pattern and a first conductive pattern are sequentially formed on the exposed substrate, and the first and second insulation layers of the preliminary isolation layer are partially removed, thereby forming a device isolation layer including a recess. A dielectric layer is formed on a top surface of the first conductive pattern and inner surfaces of the recess of the isolation layer. A second conductive layer is formed on the dielectric layer to a thickness to fill up the recess, thereby preventing a parasitic capacitance between the first conductive patterns.

According to another exemplary embodiment of the present invention, there is provided another method of manufacturing a non-volatile memory device. A tunnel oxide pattern, a first floating gate pattern and a hard mask pattern are sequentially formed on a substrate so that the substrate is partially exposed through the tunnel oxide pattern, the first floating gate pattern and the hard mask pattern. The exposed substrate is etched using the hard mask pattern as an etching mask, thereby forming a trench at a surface portion of the substrate. Conductive structures on the substrate are isolated from each other by the trench. A first insulation layer is formed on top and side surfaces of the hard mask pattern and on inner surfaces of the trench, so that the trench is partially filled with the first insulation layer. A second insulation layer is formed on the first insulation layer to a thickness to fill up the trench, thereby forming a preliminary isolation layer including the first and second insulation layers. An etching rate of the second insulation layer is different from that of the first insulation layer. The hard mask pattern is removed from the first floating gate pattern, and a second floating gate pattern is formed on the first floating gate pattern. The first and second insulation layers of the preliminary isolation layer are partially removed, thereby forming an isolation layer including a recess. A dielectric layer is formed on top and side surfaces of the second floating gate pattern and inner surfaces of the recess of the isolation layer. A conductive layer is formed on the dielectric layer to a thickness to fill up the recess, thereby preventing a parasitic capacitance between the first floating gate patterns.

According to embodiments of the present invention, a recess is formed at a central portion of the device isolation layer, not by a dry etching process using plasma, but by a wet etching process, and a conductive layer for a control gate is formed to a position lower than a top surface of the substrate in the recess, so that a parasitic capacitance between floating gates adjacent to each other may be reduced in a non-volatile memory device.

BRIEF DESCRIPTION OF THE DRAWINGS

The above and other features and advantages of the present invention will become readily apparent by reference to the following detailed description when considering in conjunction with the accompanying drawings, in which.

DESCRIPTION OF THE EMBODIMENTS OF THE INVENTION

Figure 1:
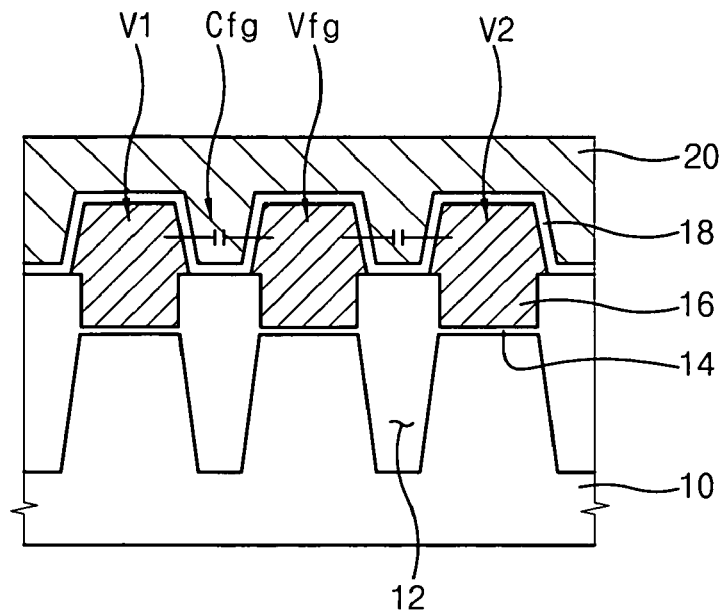
FIG. 1 is a cross sectional view illustrating a conventional non-volatile memory device.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y." Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiment 1

FIGS. 2 to 6 are cross-sectional views illustrating processing steps for a method of forming a device isolation layer according to a first exemplary embodiment of the present invention.

Figure 2:
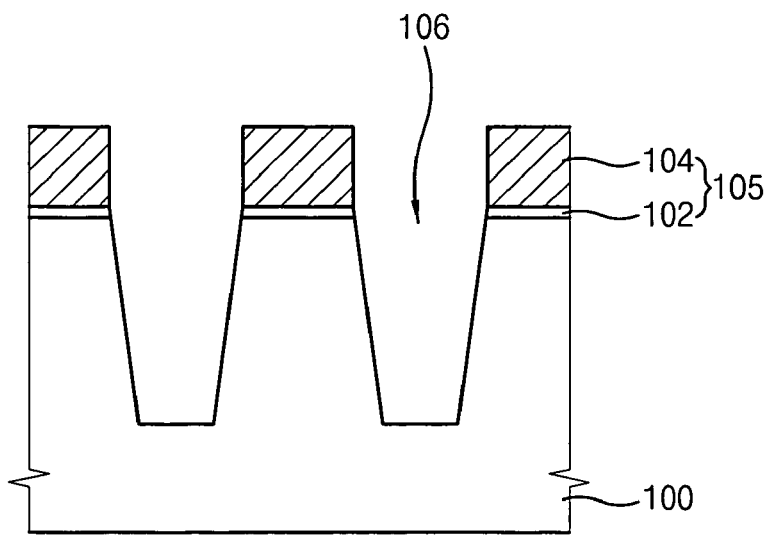
FIGS. 2 to 6 are cross sectional views illustrating processing steps for a method of forming a device isolation layer according to a first exemplary embodiment of the present invention.

Referring to FIG. 2, a pad oxide layer (not shown) is formed on a substrate 100 to a thickness of about 50 Å to about 200 Å for reducing stress when silicon nitride is deposited in a subsequent process. A silicon nitride layer (not shown) is formed on the pad oxide layer. Then, the silicon nitride layer and the pad oxide layer are partially and sequentially etched away, thereby forming a pad oxide pattern 102 and a silicon nitride pattern 104 sequentially stacked on the substrate 100. In the present embodiment, the pad oxide pattern 102 and the silicon nitride pattern 104 function as a hard mask pattern 105 in a subsequent process. The surface portion of the substrate 100 is etched away using the hard mask pattern 105 as an etching mask, thereby forming a trench 106 by which conductive structures on the substrate 100 are isolated from each other.

Figure 3:
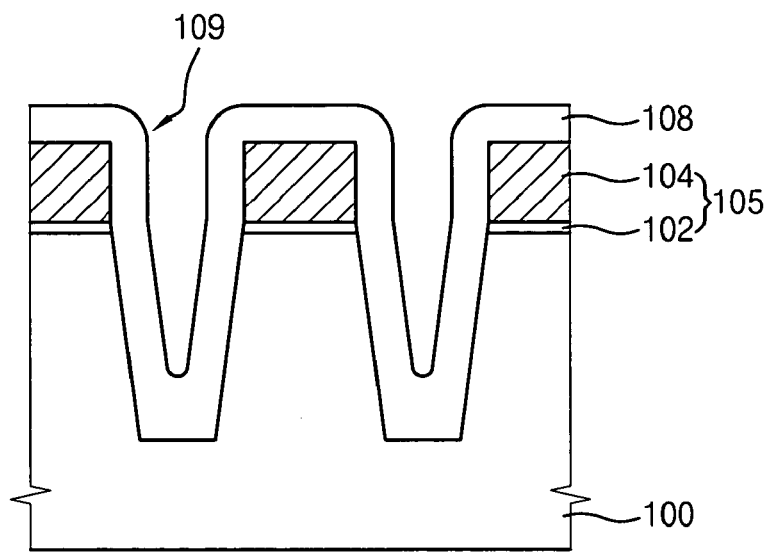

Referring to FIG. 3, a first insulation layer 108 is formed on a top surface of the hard mask pattern 105 and on bottom and side surfaces of the trench 106, so that a size of the trench 106 is reduced by the first insulation layer 108. Hereinafter, the trench 106 downsized by the first insulation layer 108 is referred to as a first recess 109. In the present embodiment, the first insulation layer 108 is comprised of silicon oxide, and a bottom surface of the first recess 109 is lower than a top surface of the substrate 100.

A bottom thickness of the first insulation layer 108 needs to be greater than a side thickness of the first insulation layer 108, so that the first insulation layer 108 is formed on the bottom surface of the trench 106 to a thickness greater than on the side surface of the trench 106. For example, the first insulation layer 108 may be formed through a sub-atmospheric pressure chemical vapor deposition (CVD) process, a low pressure CVD process or an atmospheric pressure CVD process.

In the above CVD processes, tetraethyl orthosilicate (TEOS) is used as a source gas for the first insulation layer 108 with a reaction gas. Examples of the reaction gas include ozone ($O_3$) gas, oxygen ($O_2$) gas, nitrous oxide ($N_2O$) gas, etc. These can be used alone or in combinations thereof.

Silane (SiH4) gas is also used as a source gas for the first insulation layer 108 in the above CVD processes with the above reaction gas.

The first insulation layer 108 has high density and low impurity concentration, thereby having a stable (or showing a constant) etching rate when the first insulation layer 108 is wet etched.

A heat treatment may be further performed on the first insulation layer 108, and in that case, the wet etching rate of the first insulation layer 108 may be controlled by varying temperature and atmosphere of the heat treatment. Particularly, the higher the temperature of the heat treatment, the higher the density of the first insulation layer 108, so that the wet etching rate of the first insulation layer is reduced as the temperature of the heat treatment increases. In the present embodiment, a first heat treatment is performed on the first insulation layer 108 at a temperature of about 200° C. to about 300° C. in an air or a nitrogen atmosphere, and a second heat treatment is performed on the first insulation layer 108 after the first heat treatment at a temperature of about 600° C. to about 800° C. in an oxygen or a water vapor atmosphere. The heat treatment may be omitted for a process simplification, as would be known to one of ordinary skill in the art.

Figure 4:
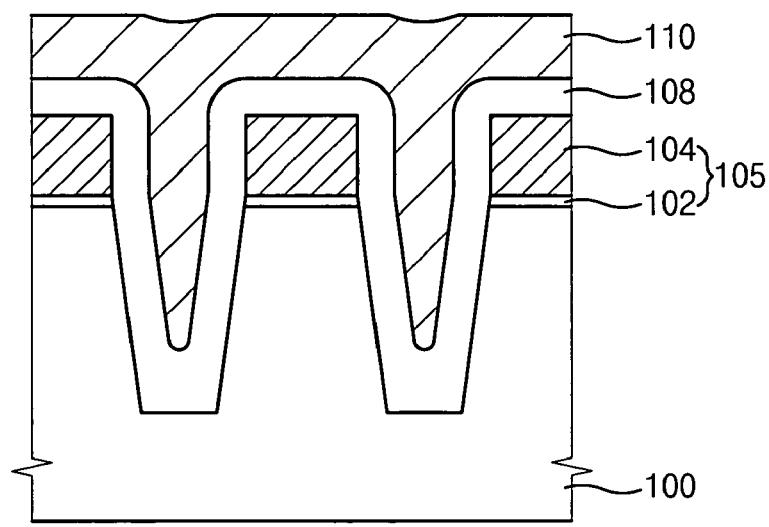

Referring to FIG. 4, a second insulation layer 110 is formed on the first insulation layer 108 to a sufficient thickness to fill up the first recess 109. An etching rate of the second insulation layer 110 is greater than that of the first insulation layer 108 under the same etching conditions.

In the present embodiment, the second insulation layer 110 is formed through a spin-on-glass (SOG) process so as to obtain excellent gap-fill characteristics because the second insulation layer 108 fills the first recess 109 of which a width is much smaller than that of the trench 106. The second insulation layer 110 is exemplarily comprised of a silazane-based material or a flowable oxide (FOx).

A heat treatment is performed on the second insulation layer 110, and in that case, a wet etching rate of the second insulation layer 110 may be controlled by varying temperature and atmosphere of the heat treatment. The higher the temperature of the heat treatment, the higher the density of the second insulation layer 110, so that the wet etching rate of the second insulation layer 110 is reduced as the temperature of the heat treatment increases.

A density of the second insulation layer 110 is lower than that of the first insulation layer 108 because the second insulation layer 110 is formed not through the CVD process but through the SOG process, so that an etching rate of the second insulation layer 110 is higher than that of the first insulation layer 108.

In the present embodiment, the second insulation layer 110 is formed through the SOG process using a silazane-based material as follows.

An SOG solution including silazane is coated on the first insulation layer 108 through a spin-coating process by a spin-coater, thereby forming an SOG layer on the first insulation layer 108 to a sufficient thickness for filling the first recess 109.

Then, a heat treatment is performed on the SOG layer, thereby forming the second insulation layer 110 on the first insulation layer 108. Particularly, a first heat treatment is performed on the SOG layer at a temperature of about 200° C. to about 300° C. in an air or nitrogen atmosphere, and a second heat treatment is performed on the SOG layer after the first heat treatment at a temperature of about 600° C. to about 800° C. in an oxygen or water vapor atmosphere. Then, a third heat treatment is performed on the SOG layer after the second heat treatment at a temperature of about 900° C. to about 1000° C. in a nitrogen or argon atmosphere.

Figure 5:
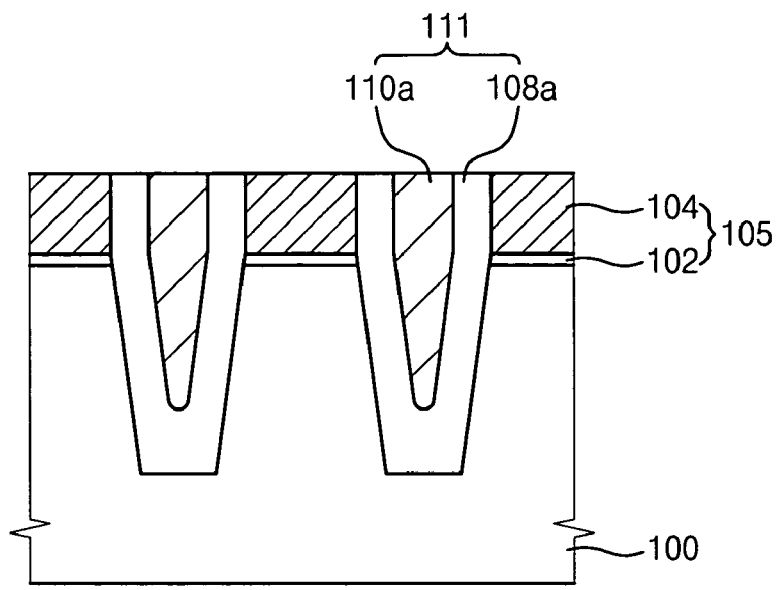

Referring to FIG. 5, the first and second insulation layers 108 and 110 are removed and planarized by a chemical mechanical polishing (CMP) process until a top surface of the hard mask pattern 105 is exposed, so that the first and second insulation layers 108 and 110 remain in the trench 106, thereby forming a preliminary device isolation layer 111 including a first insulation pattern 108a and a second insulation pattern 110a.

Figure 6:
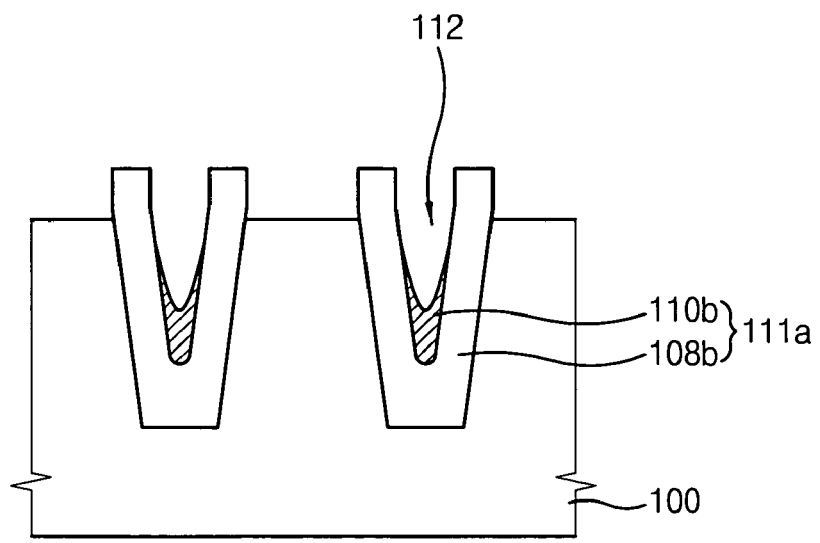

Referring to FIG. 6, the silicon nitride pattern 104 of the hard mask pattern 105 is removed through a wet etching process using an etchant including phosphoric acid ($H_3PO_4$).

Then, the pad oxide pattern 102 of the hard mask pattern 105 is removed from the substrate 100, so that the substrate 100 is partially exposed through the first insulation pattern 108a. A conductive structure is formed on the exposed substrate in subsequent processes; thus, the exposed substrate corresponds to an active region of the substrate. The first and second insulation patterns 108a and 110a are partially etched away during the etching process against the pad oxide pattern 102, thereby forming a device isolation layer 111a including downsized first and second insulation patterns 108b and 110b. The device isolation layer 111a has a second recess 112 on a central portion thereof due to a difference of etching rates between the first and second insulation patterns 108a and 110a.

Particularly, when an etchant for wet etching the pad oxide pattern 102 is supplied on the substrate 100, the first and second insulation patterns 108a and 110a are also etched away simultaneously with the pad oxide pattern 102. Since the second insulation pattern 110a is etched away more rapidly than the first insulation pattern 108a, a top surface of the second insulation pattern 110a is much lower than a top surface of the first insulation pattern 108a. As a result, the downsized second insulation pattern 110b is formed in the downsized first insulation pattern 108b; thus, the second recess 112 is formed at the central portion of the downsized first insulation pattern 108b. In the present embodiment, etching conditions are controlled such that the top surface of the downsized second insulation pattern 110b is lower than a top surface of the substrate 100, so that a bottom surface of the second recess 112 is formed at a position much lower than the top surface of the substrate 100. Although the present embodiment discloses that the second insulation pattern 110a is partially etched away during the wet etching process against the pad oxide pattern 102, the second insulation pattern 110a could also be completely etched away from the substrate 100, as would be known to one of the ordinary skill in the art.

According to the present embodiment, the device isolation layer has a recess, which almost extends around a bottom surface of a trench, at a central portion thereof, and a dummy pattern for reducing a parasitic capacitance is formed in the recess of the device isolation layer. Accordingly, the parasitic capacitance is sufficiently reduced due to the dummy pattern in the recess.

Embodiment 2

FIGS. 7 to 12 are cross-sectional views illustrating processing steps for a method of manufacturing a semiconductor device according to a second exemplary embodiment of the present invention. A device isolation layer for the semiconductor device is formed in the same or similar way as in Embodiment 1, described above.

Figure 7:
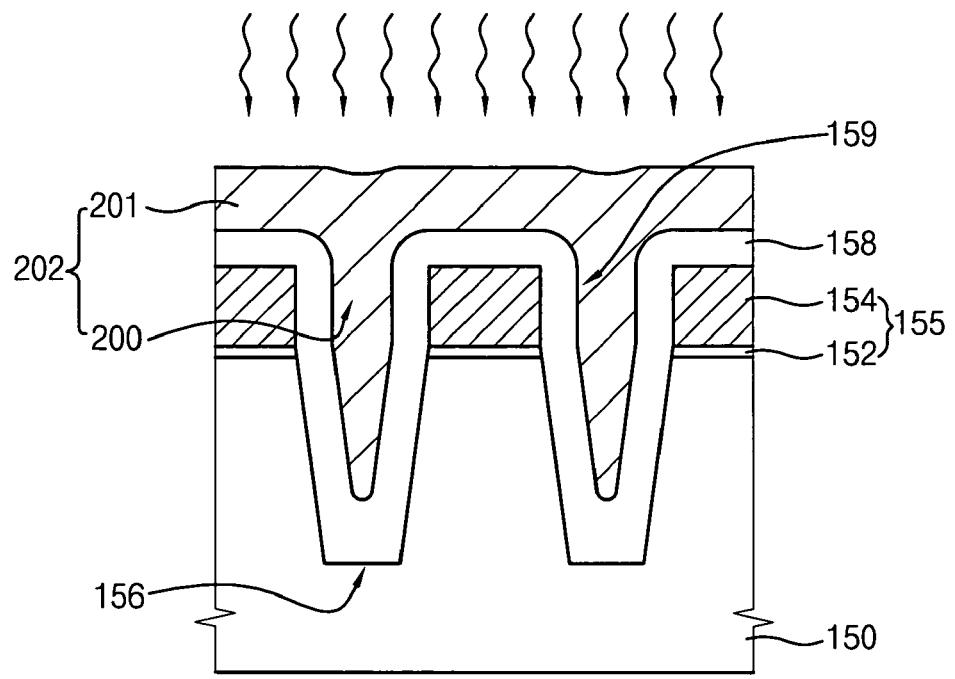
FIGS. 7 to 12 are cross sectional views illustrating processing steps for a method of manufacturing a semiconductor device according to a second exemplary embodiment of the present invention.

Referring to FIG. 7, the same process as described with reference to FIGS. 2 to 4 is performed on a semiconductor substrate 150. As described above, a pad oxide layer (not shown) and a silicon nitride layer (not shown) are formed on the substrate 150 for reducing stress during formation of the silicon nitride layer. The silicon nitride layer functions as a mask layer for forming the device isolation layer, and also defines a floating gate region in which a floating gate is formed in subsequent processes. As a result, the silicon nitride layer is formed to a thickness greater than that of a desired floating gate.

Then, the silicon nitride layer and the pad oxide layer are partially and sequentially etched away, thereby forming a pad oxide pattern 152 and a silicon nitride pattern 154 sequentially stacked on the substrate 150. In the present embodiment, the pad oxide pattern 152 and the silicon nitride pattern 154 function as a hard mask pattern 155 in a subsequent process. A surface portion of the substrate 150 is etched away using the hard mask pattern 155 as an etching mask, thereby forming a trench 156 by which conductive structures on the substrate 150 are isolated from each other. Hereinafter, a portion of the substrate 150 on which the conductive structures are positioned is referred to as an active region of the substrate 150.

A first insulation layer 158 is formed on a top surface of the hard mask pattern 155 and on bottom and side surfaces of the trench 156, so that a size of the trench 156 is reduced by the first insulation layer 158. Hereinafter, the trench 156 downsized by the first insulation layer 158 is referred to as a first recess 159. In the present embodiment, the first insulation layer 158 is comprised of silicon oxide, and a bottom surface of the first recess 159 is lower than a top surface of the substrate 100. The first insulation layer 108 may be formed by a sub-atmospheric pressure chemical vapor deposition (CVD) process, a low pressure CVD process or an atmospheric pressure CVD process.

In the above CVD processes, tetraethyl orthosilicate (TEOS) is used as a source gas for the first insulation layer 108 with reaction gas. Examples of the reaction gas include ozone ($O_3$) gas, oxygen ($O_2$) gas, nitrous oxide ($N_2O$) gas, etc. These can be used alone or in combinations thereof.

Silane ($SiH_4$) gas is also used as a source gas for the first insulation layer 108 in the above CVD processes with the above reaction gas.

A heat treatment may be further performed on the first insulation layer 158, and in that case, the wet etching rate of the first insulation layer 158 may be controlled by varying temperature and atmosphere of the heat treatment.

A preliminary insulation layer (not shown) is formed on the first insulation layer 158 to a sufficient thickness to fill up the first recess 159. An etching rate of the preliminary insulation layer is greater than that of the first insulation layer 158 under the same etching conditions.

In the present embodiment, the preliminary insulation layer is formed through a spin on glass (SOG) process so as to obtain excellent gap-fill characteristics because the preliminary insulation layer fills the first recess 159 of which a width is much smaller than that of the trench 156. The preliminary insulation layer is exemplarily comprised of a silazane-based material or a flowable oxide (FOx).

A heat treatment is performed on the preliminary insulation layer in such a way that an etching rate of an upper portion of the preliminary insulation layer is lower than that of a lower portion of the preliminary insulation layer, thereby forming a second insulation layer 202 on the first insulation layer 158. That is, the upper portion 201 of the second insulation layer 202, which is above a top surface of the hard mask pattern 155, has an etching rate smaller than that of the lower portion 200 of the second insulation layer 202, which is under the top surface of the hard mask pattern 155. The etching rate of the second insulation layer 202 is controlled by varying a temperature and an atmosphere of the heat treatment. The higher the temperature of the heat treatment, the higher the density of the second insulation layer 202, so that the etching rate of the second insulation layer 202 is reduced as the temperature of the heat treatment increases.

A silazane-based material or a FOx is coated on the first insulation layer 158, thereby forming the preliminary insulation layer on the first insulation layer 158 to a sufficient thickness for filling the first recess 159. Then, the heat treatment is performed on the preliminary insulation layer, thereby forming the second insulation layer 202 on the first insulation layer 158. Particularly, a first heat treatment is performed on the preliminary layer at a temperature of about 200° C. to about 300° C. in an air or a nitrogen atmosphere, and the temperature increases to a range of about 600° C. to 800° C. at a ramping speed of about 100° C./minute or more. Then, a second heat treatment is performed on the preliminary insulation layer at a temperature of about 600° C. to about 800° C. in an oxygen or a water vapor atmosphere, and the temperature increases to a range of about 900° C. to 1000° C. at a ramping speed of about 100° C./minute or more. A third heat treatment is performed on the preliminary insulation layer at a temperature of about 900° C. to about 1000° C. in a nitrogen or an argon atmosphere.

Because the temperature of the heat treatment rapidly increases at a ramping speed of about 100° C./minute or more, the upper portion of the preliminary insulation layer undergoes a sufficient heat treatment, so that a density of the preliminary insulation layer becomes sufficiently high at the upper portion thereof while the lower portion of the preliminary insulation layer undergoes an insufficient heat treatment, so that a density of the preliminary insulation layer is relatively low and the preliminary insulation layer does not become sufficiently dense. A portion of low density is etched away more rapidly than a portion of high density in the preliminary insulation layer even under the same etching conditions. As a result, the above heat treatment causes the second insulation layer 202 to have a low etching rate at an upper portion 201 thereof and a high etching rate at a lower portion 200 thereof.

A variation of the etching rate in accordance with the ramping speed in the heat treatment was confirmed by experiments.

Figure 13:
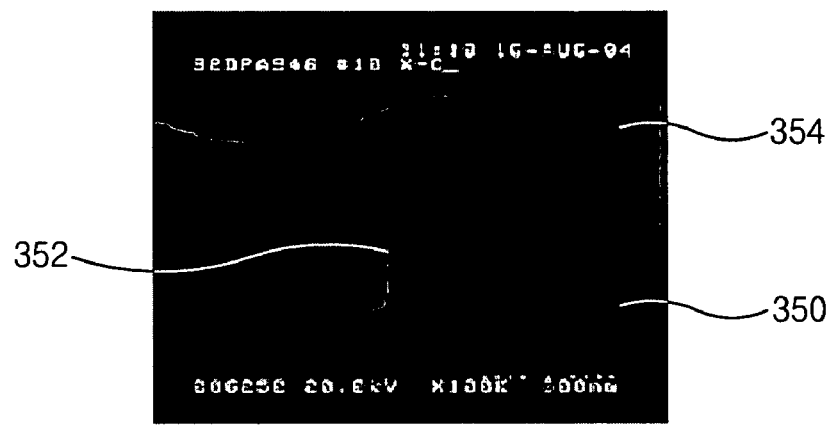
FIGS. 13 and 14 are pictures illustrating a difference of the etching rate in accordance with the ramping speed at upper and lower portions of a spin on glass (SOG) material layer.
Figure 14:
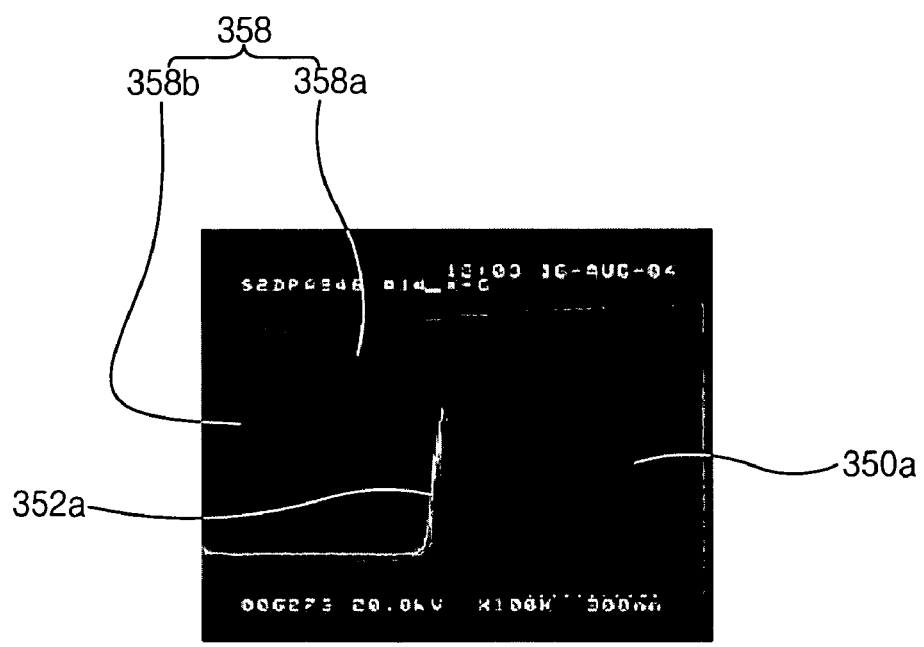

FIGS. 13 and 14 are pictures illustrating a difference of the etching rate in accordance with the ramping speed at upper and lower portions of an SOG material layer.

FIG. 13 is a picture taken by a scanning electron microscope (SEM) when the ramping speed is about 50° C./minute or less as follows.

An SOG material layer 354 was coated on a substrate 350 on which a trench 352 was formed, and a first heat treatment was performed on the SOG material layer 354 at a temperature of about 250° C. in a nitrogen atmosphere. Then, the temperature of the heat treatment increased to about 800° C. at a ramping speed of about 50° C./minute or less. A second heat treatment was performed on the SOG material layer at the temperature of about 800° C. in an oxygen atmosphere. Then, the substrate 350 was vertically cut out to expose the trench portion in which the SOG material layer 354 was filled, and a wet etching process was performed on the substrate piece for a predetermined time.

FIG. 14 is a picture taken by a scanning electron microscope (SEM) when the ramping speed is about 100° C./minute or more as follows.

An SOG material layer 358 was coated on a substrate 350a on which a trench 352a was formed, and a first heat treatment was performed on the SOG material layer 358 at a temperature of about 250° C. in a nitrogen atmosphere. Then, the temperature of the heat treatment increased to about 800° C. at a ramping speed of about 100° C./minute or more. A second heat treatment was performed on the SOG material layer 358 at the temperature of about 800° C. in an oxygen atmosphere. Then, the substrate 350a was vertically cut out to expose the trench portion in which the SOG material layer 358 was filled, and a wet etching process was performed on the substrate piece for a predetermined time.

Referring to FIG. 13, when the ramping speed was relatively low, the SOG material layer 354 was hardly etched away since the heat treatment was performed on almost all the SOG material layer; thus, the density of the layer was sufficiently high at the upper and lower portions of the layer. That is, FIG. 13 confirms that the etching rate was almost the same across the SOG material layer.

Referring to FIG. 14, when the ramping speed was relatively high, the upper portion 358a of the SOG material layer 358 was hardly etched away while the lower portion 358b of the SOG material layer 358 was considerably etched away. FIG. 14 confirms that a high ramping speed caused the SOG material layer 358 to have a low etching rate at the upper portion 358a thereof and a high etching rate at a lower portion 358b thereof.

Figure 8:
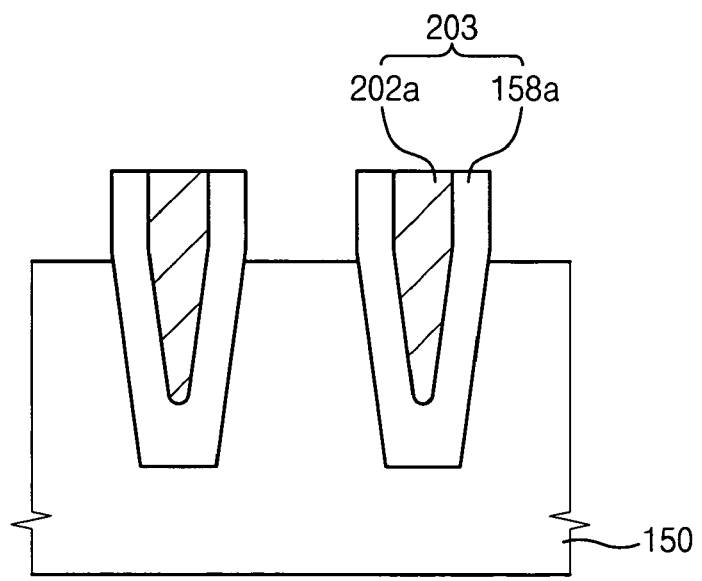

Referring to FIG. 8, the first and second insulation layers 158 and 202 are removed and planarized by a chemical mechanical polishing (CMP) process until a top surface of the hard mask pattern 155 is exposed, so that the first and second insulation layers 158 and 202 remain in the trench 156, thereby forming a preliminary device isolation layer 203 including a first insulation pattern 158a and a second insulation pattern 202a.

The silicon nitride pattern 154 of the hard mask pattern 155 is removed through a wet etching process using an etchant including phosphoric acid ($H_3PO_4$).

Then, the pad oxide pattern 152 of the hard mask pattern 155 is removed from the substrate 150, so that the substrate 150 is partially exposed through the first insulation pattern 158a. In the present embodiment, the pad oxide pattern 152 is etched away using a Limulus Amoebocyte Lysate (LAL) solution. The first and second insulation patterns 158a and 202a are partially etched away during the etching process against the pad oxide pattern 152, thereby forming a preliminary device isolation layer 203 including the first and second insulation patterns 158a and 202a. The upper portion of the second insulation pattern 202a has a relatively low etching rate due to the above heat treatment, so that the second insulation pattern 202a is considerably resistive to the wet etching process using the LAL solution.

Accordingly, the preliminary device isolation layer 203 is protruded from the substrate 150 in the trench 156, and a portion of the substrate 150 is exposed between adjacent preliminary device isolation layers 203. A conductive structure is formed on the exposed substrate 150. In the present embodiment, a top surface of the device isolation layer 203 is higher than a top surface of a floating gate that is to be formed on the exposed substrate 150 in a subsequent process.

Figure 9:
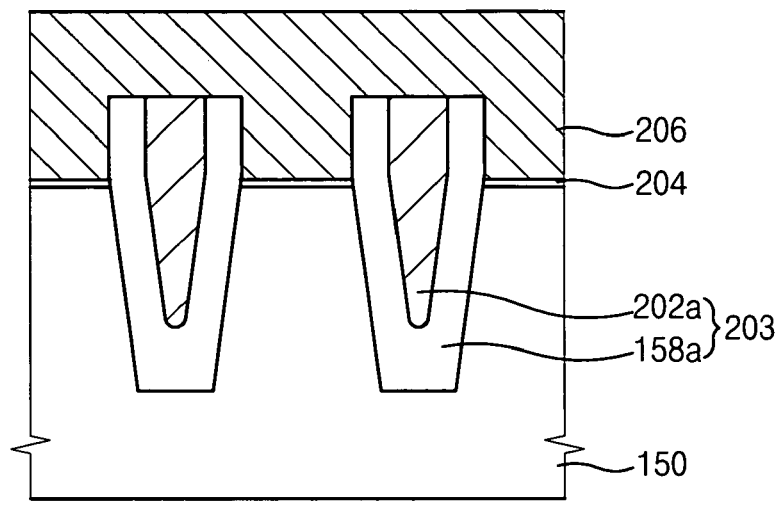

Referring to FIG. 9, a tunnel oxide layer 204 is formed on the exposed substrate 150. Examples of the tunnel oxide layer include a silicon oxide layer, a silicon oxide layer doped with fluorine, a silicon oxide layer doped with carbon, a material layer comprised of a low dielectric material such as low-k material, etc.

A polysilicon layer 206 is formed on the tunnel oxide layer 204 to a sufficient thickness to fill gaps between the preliminary device isolation layers 203. In the present embodiment, the polysilicon layer 206 is formed by a low pressure chemical vapor deposition (LPCVD) process.

Figure 10:
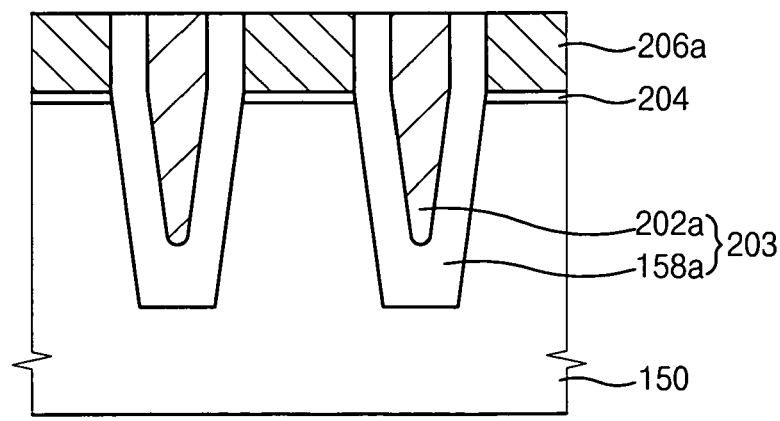

Referring to FIG. 10, the polysilicon layer 206 is removed and planarized through a CVD process until a top surface of the preliminary device isolation layer 203 is exposed, so that the polysilicon layer 206 remains in the gap between the preliminary device isolation layers 203, thereby forming a floating gate pattern 206a on the substrate 150.

Figure 11:
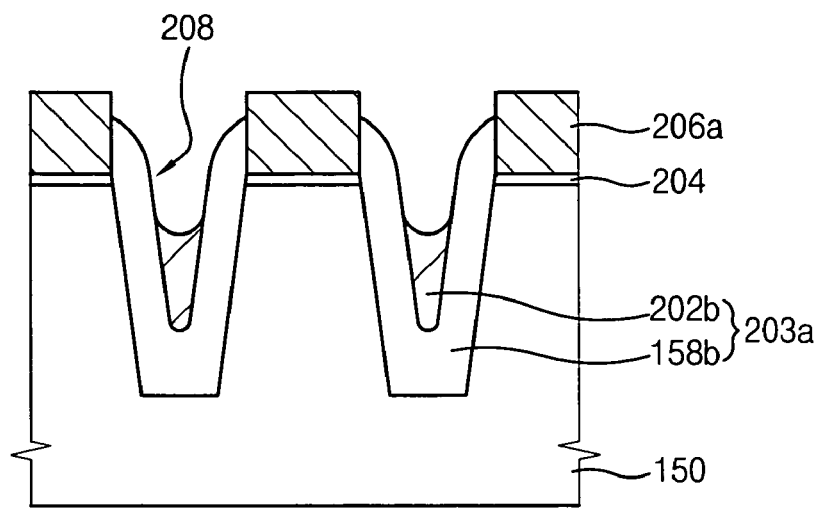

Referring to FIG. 11, the preliminary device isolation layer 203 is partially etched away using an etchant having an etching selectivity with respect to the floating gate pattern 206a, thereby forming a device isolation layer 203a having a second recess 208 at a central portion thereof. In the present embodiment, an LAL solution may be used as an etchant of the wet etching against the preliminary device isolation layer 203.

Particularly, when an etchant for wet etching the preliminary device isolation layer 203 is supplied onto a top surface of preliminary device isolation layer 203, the wet etching process starts at a top surface of the first and second insulation patterns 158a and 202a at a similar etching rate while the floating gate pattern 206a still remains un-etched due to the etching selectivity. Accordingly, upper portions of the first and second insulation patterns 158a and 202a are etched away to the same predetermined depth. Then, the second insulation pattern 202a is etched away more rapidly than the first insulation layer 158a because an etching rate of the second insulation pattern 202a is greater at a lower portion thereof than at an upper portion thereof. The second insulation pattern 202a is etched away to a depth relatively greater than the first insulation pattern 158a for the same amount of time, so that the second recess 208 is formed at a central portion of the first insulation pattern 158a, thereby forming a device isolation layer 203a including downsized first and second insulation patterns 158b and 202b, and the second recess 208 at a central portion thereof. Although the present embodiment discloses that the second insulation pattern 202a is partially etched away during the wet etching process, the second insulation pattern 202a could also be completely etched away, as would be known to one of ordinary skill in the art.

Figure 12:
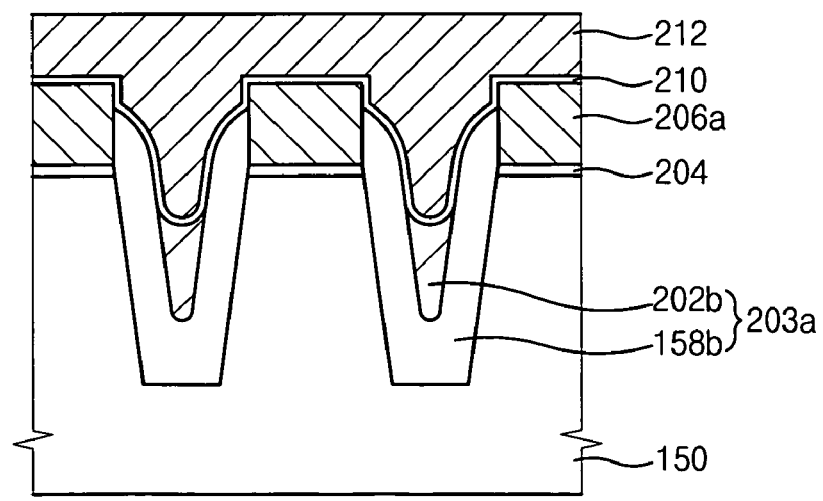

Referring to FIG. 12, a dielectric layer 210 is formed on a top surface of the floating gate pattern 206a and inner surfaces of the second recess 208. Examples of the dielectric layer 210 include one of an oxide/nitride/oxide composite layer (hereinafter referred to as ONO layer) and a material layer comprised of a material of a high dielectric constant.

A conductive layer (not shown) is formed on the dielectric layer 210 to a sufficient thickness to fill up the second recess 208. The conductive layer may include a polysilicon layer or a multi-layer including the polysilicon layer. Examples of the multi-layer include one of a polysilicon/metal silicide layer and a polysilicon/metal layer. The conductive layer is patterned through a photolithography process, thereby forming a control gate 212. The dielectric layer 210 and the floating gate pattern 206a, which are exposed during the above patterning process for the control gate 212, are partially etched, thereby forming a floating gate on the tunnel oxide layer 204.

In the present embodiment, the control gate 212 extends to a position lower than a top surface of the substrate 150 between the floating gates, so that two floating gates adjacent to each other do not directly face each other, thereby reducing the parasitic capacitance between the floating gates adjacent to each other.

According to the exemplary embodiment of the non-volatile memory device, the parasitic capacitance between the floating gates adjacent to each other is reduced, thereby improving a cell distribution. For this reason, the non-volatile memory device may be stably operated despite multi-level cells therein. Furthermore, an additional dry etching process is not required in manufacturing a non-volatile memory device, so that the memory device is prevented from being damaged by plasma. Accordingly, operation characteristics and reliability of the memory device are sufficiently improved.

Embodiment 3

FIGS. 15 to 19 are cross-sectional views illustrating processing steps for a method of manufacturing a non-volatile memory device according to a third exemplary embodiment of the present invention.

Figure 15:
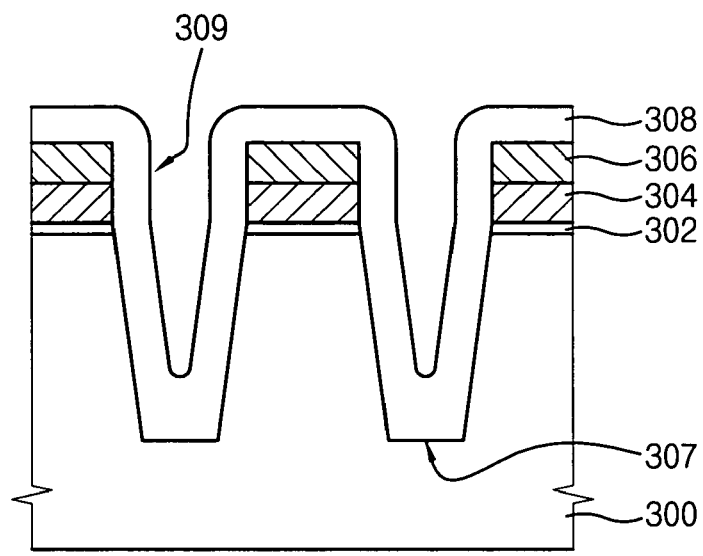
FIGS. 15 to 19 are cross sectional views illustrating processing steps for a method of manufacturing a non-volatile memory device according to a third exemplary embodiment of the present invention.

Referring to FIG. 15, a tunnel oxide layer (not shown) is formed on a substrate 300. Examples of the tunnel oxide layer include a silicon oxide layer, a silicon oxide layer doped with fluorine, a silicon oxide layer doped with carbon, a material layer comprised of a low dielectric material such as low-k material, etc.

A first polysilicon layer (not shown) is formed on the tunnel oxide layer so as to form a lower floating gate pattern, and a silicon nitride layer (not shown) is formed on the first polysilicon layer so as to form a hard mask layer.

The silicon nitride layer is patterned through a photolithography process, thereby forming a hard mask pattern 306. The first polysilicon layer and the tunnel oxide layer are sequentially and partially etched away using the hard mask pattern 306 as an etching mask, thereby forming a tunnel oxide pattern 302 and a lower floating gate pattern 304. The substrate 300 is also partially etched away using the hard mask pattern 306 as an etching mask, thereby forming a trench 307.

A first insulation layer 308 is formed on top and side surfaces of the hard mask pattern 306 and inner surfaces of the trench 307, so that the first insulation layer 308 has a first recess 309 in the trench 307. In the present embodiment, the first insulation layer 308 is comprised of silicon oxide, and a bottom surface of the first recess 309 is lower than a top surface of the substrate 300. For example, the first insulation layer 308 may be formed through a sub-atmospheric pressure chemical vapor deposition (CVD) process, a low pressure CVD process or an atmospheric pressure CVD process. In the present embodiment, the first insulation layer 308 is formed through the same process as in Embodiment 2.

Figure 16:
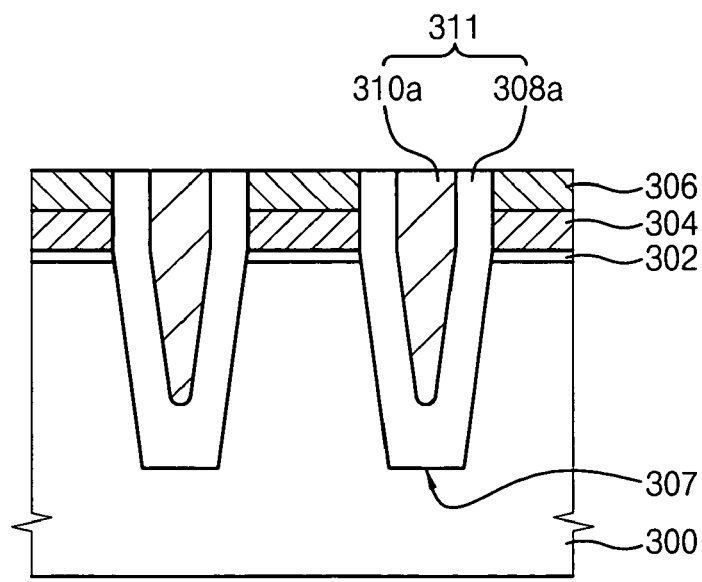

Referring to FIG. 16, a second insulation layer (not shown) is formed on the first insulation layer 308 to a sufficient thickness to fill up the first recess 309. An etching rate of the second insulation layer is higher than that of the first insulation layer 308 on the same etching conditions. In the present embodiment, the second insulation layer is formed through a spin on glass (SOG) process so as to obtain excellent gap-fill characteristics because the second insulation layer fills the first recess 309 of which a width is much smaller than that of the trench 307. The second insulation layer is exemplarily comprised of a silazane-based material or a flowable oxide (FOx).

A heat treatment is performed on the second insulation layer, and in that case, the etching rate of the second insulation layer may be controlled by varying a temperature and an atmosphere of the heat treatment. The higher the temperature of the heat treatment, the higher the density of the second insulation layer, so that the wet etching rate of the second insulation layer is reduced as the temperature of the heat treatment increases.

As compared with Embodiment 2, formation and removal processes of the pad oxide layer and a CMP process for a floating gate pattern are omitted, so that an etching rate of an upper portion of the second insulation layer is substantially identical to that of a lower portion of the second insulation layer. Accordingly, no limit of the ramping speed is allowed when the heat treatment is performed on the second insulation layer.

A density of the second insulation layer is lower than that of the first insulation layer 308 because the second insulation layer is formed not through a CVD process but through an SOG process, so that an etching rate of the second insulation layer is higher than that of the first insulation layer 308 on the same etching conditions.

The first insulation layer 308 and the second insulation layer are removed and planarized by a CMP process until a top surface of the hard mask pattern 306 is exposed, so that the first insulation layer 308 and the second insulation layer only remain in the trench 307, thereby forming a preliminary device isolation layer 311 including a first insulation pattern 308a and a second insulation pattern 310a.

Figure 17:
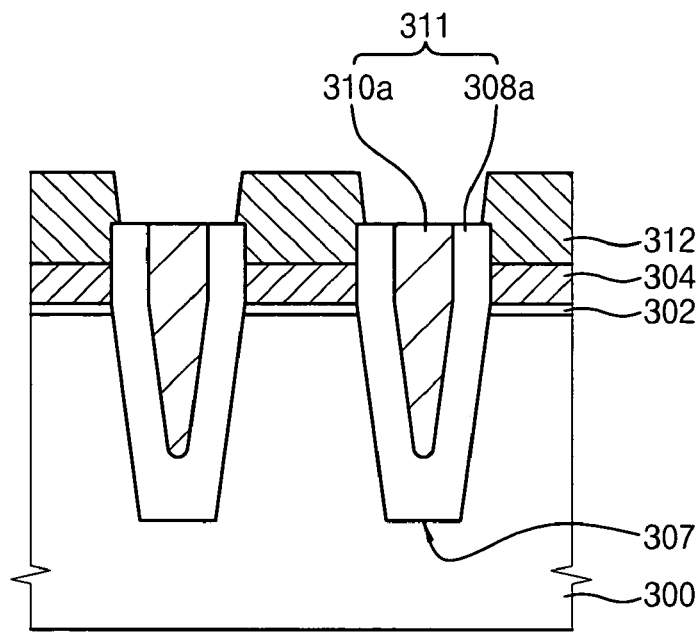

Referring to FIG. 17, the hard mask pattern 306 is removed through a wet etching process using an etchant including phosphoric acid ($H_3PO_4$), so that the lower floating gate pattern 304 is exposed.

A second polysilicon layer (not shown) is formed on the lower floating gate pattern 304 and the preliminary device isolation layer 311, and is partially etched through a photolithography process, thereby forming an upper floating gate pattern 312 on the lower floating gate pattern 304. The preliminary device isolation layer 311 is exposed through the upper and lower floating gate patterns 312 and 304.

Figure 18:
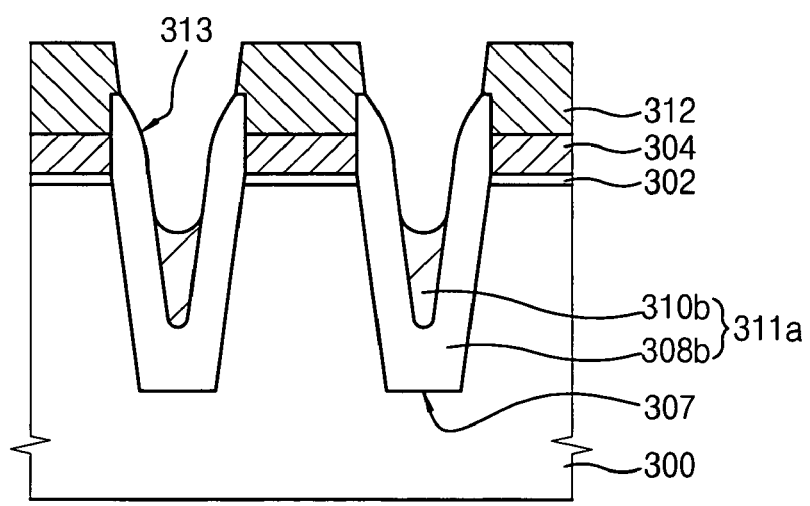

Referring to FIG. 18, the preliminary device isolation layer 311 is partially etched away through a wet etching process using an etchant including a LAL solution, so that a second recess 313 is formed at a central portion of the preliminary device isolation layer 311, thereby forming a device isolation layer 311a.

Particularly, when the etchant for wet etching the preliminary device isolation layer 311 is supplied onto a top surface of the preliminary device isolation layer 311, the second insulation pattern 310a is etched away more rapidly than the first insulation layer 308a because an etching rate of the second insulation pattern 310a is greater than the first insulation layer 308a. The second insulation pattern 310a is etched away to a depth relatively greater than the first insulation pattern 308a for the same etching time, so that the second recess 313 is formed at a central portion of the first insulation pattern 308a, thereby forming a device isolation layer 311a including downsized first and second insulation patterns 308b and 310b, and the second recess 313 at a central portion thereof. Although the present embodiment discloses that the second insulation pattern 310a is partially etched away during the wet etching process, the second insulation pattern 310a could also be completely etched away, as would be known to one of ordinary skill in the art.

Figure 19:
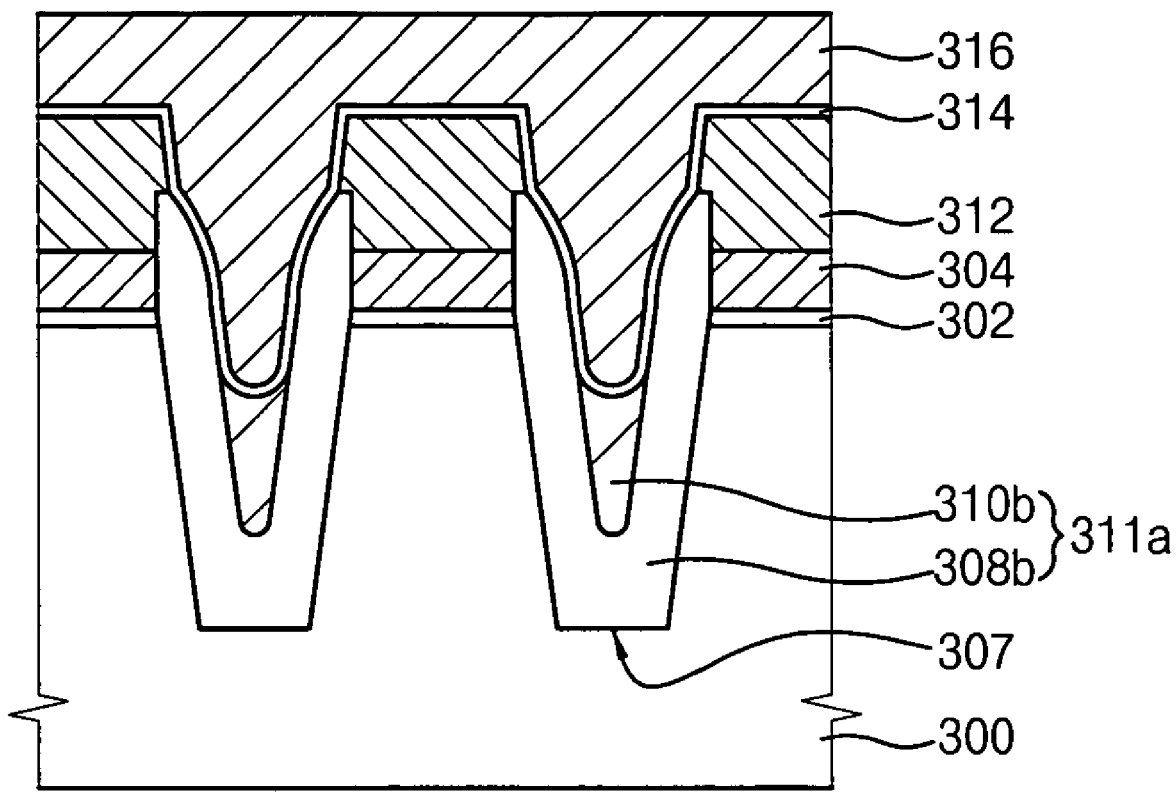

Referring to FIG. 19, a dielectric layer 314 is formed on top and side surfaces of the upper floating gate pattern 312 and inner surfaces of the second recess 313. Examples of the dielectric layer 314 include one of an oxide/nitride/oxide composite layer (ONO layer) and a material layer comprised of a material of high dielectric constant.

A conductive layer (not shown) is formed on the dielectric layer 314 to a sufficient thickness to fill up the second recess 313. The conductive layer may include a polysilicon layer or a multi-layer including the polysilicon layer. Examples of the multi-layer include one of a polysilicon/metal silicide layer and a polysilicon/metal layer. The conductive layer is patterned through a photolithography process, thereby forming a control gate 316. The dielectric layer 314 and the upper and lower floating gate patterns 304 and 312, which are exposed during the above patterning process for the control gate 316, are partially etched, thereby forming a floating gate on the tunnel oxide layer 302.

In the present embodiment, the control gate 316 extends to a position lower than a top surface of the substrate 300 between the floating gates, so that two floating gates adjacent to each other do not directly face each other, thereby reducing the parasitic capacitance between the floating gates adjacent to each other.

According to the present invention, a recess is formed at a central portion of the device isolation layer not by a dry etching process using plasma but by a wet etching process, and a conductive layer for a control gate is formed to a position lower than a top surface of the substrate in the recess, so that a parasitic capacitance between floating gates adjacent to each other may be sufficiently reduced. As a result, damage to the substrate 300 due to plasma in forming the recess through a dry etching process is minimized, thereby improving operation characteristics of a non-volatile memory device.

Although the exemplary embodiments of the present invention have been described, it is understood that the present invention should not be limited to these exemplary embodiments but various changes and modifications can be made by one skilled in the art within the spirit and scope of the present invention as hereinafter claimed.

What is claimed is:

1. A method of forming an isolation layer on a substrate, comprising:

forming a hard mask pattern on the substrate;

etching the substrate using the hard mask pattern as an etching mask, thereby forming a trench at a surface portion of the substrate;

forming a first insulation layer on top and side surfaces of the hard mask pattern and on inner surfaces of the trench, thereby forming a first recess including a portion of the trench and a portion of a space between the hard mask patterns;

forming a second insulation layer on the first insulation layer to a thickness to fill up the first recess an etching rate of the second insulation layer being different from that of the first insulation layer;

partially removing the first and the second insulation layers from the substrate such that the first and second insulation layers only remain in the trench and the space, thereby forming a preliminary isolation layer having a first insulation pattern and a second insulation pattern in the trench and the space; and performing an etching process against the preliminary isolation layer and the hard mask pattern such that the hard mask pattern is removed from the substrate to expose an active region of the substrate and the second insulation pattern is etched off more than the first insulation pattern to form a second recess surrounded by the first insulation pattern, thereby forming the isolation layer in the trench in such a configuration that a bottom surface of the second recess is at a position lower than a top surface of the substrate and a top surface of the first insulation layer is at a position higher than the top surface of the substrate.

2. The method of claim 1, wherein the first insulation layer includes a silicon oxide layer formed through one of a sub-atmospheric pressure chemical vapor deposition (CVD) process, a low pressure CVD process or an atmospheric pressure CVD process.

3. The method of claim 1, wherein the second insulation layer has an etching layer higher than that of the first insulation layer under a substantially same condition.

4. The method of claim 1, wherein the second insulation layer is formed through a spin-on-glass (SOG) process.

5. The method of claim 4, wherein the second insulation layer is comprised of one of a silazane-based material and a flowable oxide (FOx).

6. The method of claim 1, wherein partially removing the first and the second insulation layers from the substrate includes:

planarizing the first and second insulation layers until a top surface of the hard mask pattern is exposed, so that the first and second insulation layers are formed into the first and second insulation patterns in the trench and the space, respectively.

7. A method of manufacturing a non-volatile memory device, comprising:

forming a hard mask pattern on a substrate;

etching the substrate using the hard mask pattern as an etching mask to thereby form a trench at a surface portion of the substrate;

forming a first insulation layer on top and side surfaces of the hard mask pattern and on inner surfaces of the trench, thereby forming a first recess including a portion of the trench and a portion of a space between the hard mask patterns;

forming a second insulation layer on the first insulation layer to a thickness to fill up the first recess an etching rate of the second insulation layer being different from that of the first insulation layer;

partially removing the first and the second insulation layers from the substrate such that the first and second insulation layers only remain in the trench and the space, thereby forming a preliminary isolation layer having a first insulation pattern and a second insulation pattern in the trench and the space;

removing the hard mask pattern from the substrate, thereby exposing an active region of the substrate defined by the preliminary isolation layer;

sequentially forming a tunnel oxide pattern and a first conductive pattern on the active region of the substrate;

partially removing the first and second insulation patterns of the preliminary isolation layer such that the second insulation pattern is etched off more than the first insulation pattern to form a second recess surrounded by the first insulation pattern, thereby forming a device isolation layer in the trench in such a configuration that a bottom surface of the second recess is at a position lower than a top surface of the substrate and a top surface of the first insulation pattern is at a position higher than the top surface of the substrate;

forming a dielectric layer on a top surface of the first conductive pattern and inner surfaces of the second recess of the device isolation layer; and forming a second conductive layer on the dielectric layer to a thickness to fill up the second recess of the device isolation layer.

8. The method of claim 7, wherein the first insulation layer includes a silicon oxide layer formed through one of a sub-atmospheric pressure chemical vapor deposition (CVD) process, a low pressure CVD process or an atmospheric pressure CVD process.

9. The method of claim 7, wherein the second insulation layer has an etching layer higher than that of the first insulation layer under a substantially same condition.

10. The method of claim 7, wherein the second insulation layer is formed through a spin-on-glass (SOG) process.

11. The method of claim 10, wherein the second insulation layer is comprised of one of a silazane-based material and a flowable oxide (FOx).

12. The method of claim 7, after forming the second insulation layer, further comprising performing a heat treatment on the second insulation layer, so that an etching rate of an upper portion of the second insulation layer is lower than that of a lower portion of the second insulation layer.

13. The method of claim 12, wherein performing the heat treatment includes:

performing a first heat treatment at a first temperature of about 200° C. to 300° C.;

increasing the first temperature to a second temperature of about 600° C. to 800° C. at a ramping speed no less than about 100° C.; and performing a second heat treatment at the second temperature in hydrogen or water vapor atmosphere.

14. The method of claim 13, after performing the second heat treatment, further comprising:

increasing the second temperature to a third temperature of about 900° C. to 1000° C. at a ramping speed no less than about 100° C.; and performing a third heat treatment at the third temperature in a nitrogen or argon atmosphere.

15. The method of claim 7, wherein the hard mask pattern includes a multi-layer having a pad oxide pattern and silicon nitride pattern sequentially stacked on the substrate.

16. The method of claim 7, wherein forming the first conductive pattern includes:

forming a first conductive layer on the active region of the substrate to a thickness for filling a gap between the preliminary isolation layers; and planarizing the conductive layer until a top surface of the preliminary isolation layer is exposed, so that the conductive layer remains only on the active region between the preliminary isolation layer.

17. The method of claim 7, wherein removing the first and second insulation patterns of the preliminary isolation layer is performed by a wet etching process.

* * * * *